United States Patent [19]

Schieve

[11] 4,412,609
[45] Nov. 1, 1983

[54] TRANSPORT SYSTEM

[75] Inventor: Edmund H. Schieve, Phoenix, Ariz.

[73] Assignee: Honeywell Information Systems Inc., Phoenix, Ariz.

[21] Appl. No.: 278,255

[22] Filed: Jun. 29, 1981

[51] Int. Cl.³ .................................................. B65G 43/00
[52] U.S. Cl. .................................................. 198/341
[58] Field of Search ............... 198/341, 718, 711, 728, 198/731, 733, 472, 858; 74/37; 414/96; 227/100

[56] References Cited

U.S. PATENT DOCUMENTS 3,513,990  5/1970  Wolle ............................ 414 X/96
3,537,633  11/1970  Hoff ............................. 227/100

FOREIGN PATENT DOCUMENTS 2705998  8/1978  Fed. Rep. of Germany ...... 198/341

Primary Examiner—Joseph E. Valenza
Assistant Examiner—Dennis J. Williamson
Attorney, Agent, or Firm—E. W. Hughes; W. W. Holloway, Jr.; L. J. Marhoefer

[57] ABSTRACT

A transport system for transporting fixtures adapted to hold a workpiece sequentially from a fixture transferor station to a fixture transferee station. A fixture guide rail interconnects the two stations and is provided with a chain guide recess that extends from one station to the other. A continuous plastic timing chain cable is mounted on a plurality of sprockets so that the chain can be made to rotate. The sprockets are positioned so that the timing chain is positioned in the chain guide recess. Drive pins are mounted in selected ones of the links of the chain so that the pins will project from one side of the chain. The drive pins initially contact a fixture positioned in the transferee station and move each fixture, in turn, along the guide rails to the transferee station. A drive motor is connected to one of the sprockets to cause the sprocket to move the chain. The distance between drive pins is substantially constant and greater than the corresponding dimension of the fixtures being transported. Control means are provided for controllnig the energization of the motor and thus the movement of the chain and fixtures transported by the drive pins.

6 Claims, 6 Drawing Figures

TRANSPORT SYSTEM

CROSS-REFERENCE TO RELATED APPLICATIONS

The following application is incorporated by reference into this application:

"Transfer System" invented by DeWayne Karcher, filed concurrently with this application, and assigned to the same assignee as this application.

BACKGROUND OF THE INVENTION

1. Field of the Invention

This invention is in the field of manufacturing apparatus and, more particularly, relates to a transport system for transporting fixtures adapted to hold a workpiece from one station to another station. The mechanism for moving the fixtures is a fixture guide rail which is provided with a chain guide recess through which a continuous loop of a cable chain can be caused to move. The chain is provided with drive pins which project from one side of the chain and which drive pins engage a fixture to move the fixture from the one station to the other along the guide rail. The spacing between drive pins is substantially uniform and greater than the corresponding dimensions of the fixture.

2. Description of the Prior Art

The development of integrated circuit (IC) chips, particularly medium and large scale IC chips, has created a need for improved manufacturing processes which lend themselves to automating the connecting of the conductive leads of a lead frame on which an IC chip is bonded to substrates when the IC chips are interconnected to form useful electronic circuits. In implementing such processes, fixtures such as those described and illustrated in U.S. Pat. No. 4,069,496, which issued on Jan. 17, 1978, can be used to removably hold a segment of a film strip on which an IC chip has been bonded to a lead frame, which frame is, in turn, attached to the segment.

In automating the process of manufacturing hybrid substrates, a plurality of fixtures is assembled, or collected, in a magazine, such as that described and illustrated in application Ser. No. 153,367, filed May 27, 1980, entitled "Material Handling Apparatus", which application is assigned to the same assignee as this application. Each of the fixtures stored in a magazine, such as that disclosed in application Ser. No. 153,367, filed May 27, 1980, may have as its workpiece an IC chip bonded to a segment of film held by each fixture. Each such magazine has the capacity of having such fixtures inserted into the magazine and subsequently removed as steps in the process of manufacturing electronic circuits.

U.S. Pat. No. 4,068,767, which issued on Jan. 17, 1978, is the closest relevant prior art known to applicant. This patent teaches a transfer mechanism which withdraws a fixture from the bottom of a stack of such fixtures in a transferor magazine and inserts, or loads, the fixtures serially into the bottom of a stack of such fixtures into a second, or transferee, magazine. The transport system for such a mechanism includes a pneumatically powered linear actuator.

There is a need for an improved transport mechanism which need not be lubricated so that it is adaptable for use in a clean environment, i.e., in a clean room, such as that in which semiconductor devices are produced or in which hybrid circuits are fabricated. There is also a need for a transport mechanism which is able to move fixtures sequentially and with precision from a transferor station in a transferor base to a transferee station in a transferee base and which is able to position the fixtures along the route at work stations located between the transferor and transferee stations so that various manufacturing steps can be performed on the workpiece carried by each fixture. One problem with the use of prior art linear actuators is that it is only possible to move a fixture from one place to another place in one step or to incrementally move the fixtures along the fixture guide rail in steps substantially equal to the dimension of the fixtures in the direction of movement with one fixture in contact with the other between the initial and last stations.

BRIEF SUMMARY OF THE INVENTION

The present invention provides an improved transport system which can be used to move fixtures carrying a workpiece from a first station to a last station. The fixtures are moved sequentially, or one after another. Connecting the two stations is a fixture guide rail which guides, or confines to one degree of freedom of movement, fixtures as they move from the one station to the other. A chain guide recess is formed in the fixture guide rail and a continuous plastic timing chain cable is mounted on sprockets with the sprockets being positioned so that the cable can move through the chain guide recess. Drive pins are positioned in selected links of the chain cable so that the pins will project from one side of the chain. As a result, as the chain cable moves, the drive pins are positioned to contact a fixture in the transferor station and to move fixtures along the fixture guide rail toward the transferee, or last, station until the fixture reaches the transferee station. The movement of the chain is caused by a motor which is operatively connected to one of the sprockets on which the continuous chain is mounted. Control means are positioned to sense when a drive pin of the chain passes the control means to produce a control signal which can be used to stop the movement of the chain for a predetermined time, or until a subsequent event occurs, which reengages the motor to start the chain moving again. The control means can also cause the chain to operate, or move, continuously at a substantially constant speed. The spacing between drive pins of the chain is substantially uniform and is greater than the dimensions of the fixtures in the direction of movement.

It is, therefore, an object of this invention to provide a transport system that can transport fixtures sequentially and in a predetermined spaced relationship from a first station to a last station.

It is another object of this invention to provides a transport system which is sufficiently clean so that it can be installed in an industrially clean environment.

It is yet another object of this invention to provide a transport system which is capable of moving fixtures from a first station to a last station in a series of controlled steps.

BRIEF DESCRIPTION OF THE DRAWINGS

Other objects, features and advantages of the invention will be readily apparent from the following description of certain preferred embodiments thereof, taken in conjunction with the accompanying drawings, although variations and modifications may be effected without departing from the spirit and scope of the novel concepts of the disclosure, and in which.

DESCRIPTION OF THE INVENTION

Figure 1:
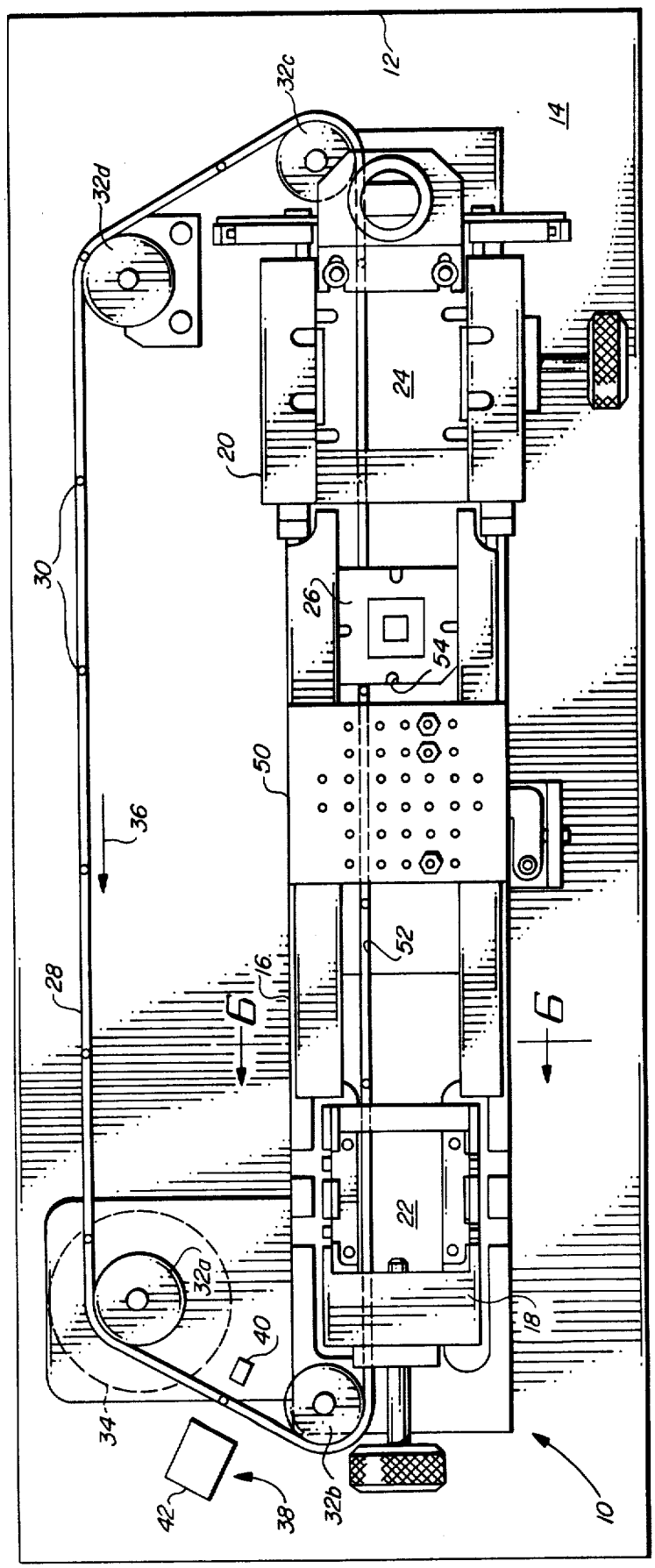
FIG. 1 is a plan view of a transfer mechanism in which the transport system of this invention is incorporated.
Figure 2:
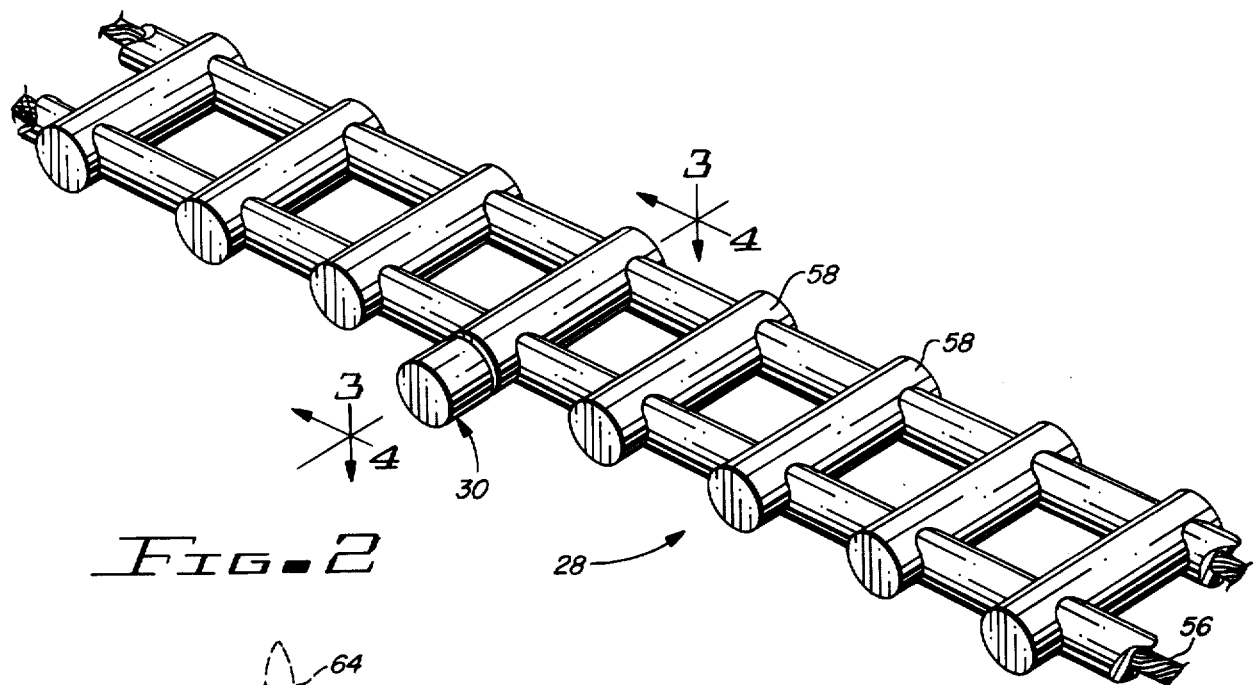
FIG. 2 is an enlarged perspective view of a portion of the continuous loop of a plastic cable chain of the transport system of this invention.

FIG. 1 is a plan view of a transfer system which is described in the U.S. patent application by DeWayne Karcher filed concurrently herewith, which is more fully identified in the section entitled CROSS-REFERENCE TO RELATED APPLICATIONS. In FIG. 1, transfer mechanism 10 is illustrated as being mounted on a support plate 12, the top surface 14 of which substantially defines a plane which is mounted horizontally. Fixture guide rail 16 is mounted on top surface 14, and a transferor base 18 and a transferee base 20 are mounted on, or are secured to, guide rail 16. Transferor base 18 and a portion of guide rail 16 define a first, or a transferor station 22. Similarly, transferee base 20 and another portion of guide rail 16 define a last, or transferee, station 24.

The transport system for transporting fixtures 26 from first station 22 to last station 24, in the preferred embodiment, includes a continuous plastic timing chain cable 28 which is provided with a plurality of drive pins 30. The pins 30 are spaced substantially uniformly along the length of chain cable 28. The distance between adjacent pins 30 is chosen to be greater than the dimension of a side of the substantially square fixture 26. In the preferred embodiment, each fixture 26 is substantially 2 inches square. Fixtures 26 are described and illustrated in U.S. Pat. No. 4,069,496, which issued on Jan. 17, 1978. Each fixture 26 is adapted to removably hold a segment of a film strip on which an IC chip has been bonded to a lead frame, which lead frame is attached to the segment.

Chain 28 is positioned on four sprockets, 32a, b, c, and d. Sprockets 32a and 32d are mounted on support plate 12 and sprockets 32b and 32c are mounted on extensions of guide rail 16 so that chain cable 28 is aligned with guide rail 16 between first fixture station 22 and last fixture station 24. A conventional electrical synchronous stepping motor 34 is mounted on the lower surface of plate 12. Sprocket wheel 32a is mounted on the shaft of motor 34 so that motor 34, when energized, causes chain 28 to move in the direction of arrow 36.

The controls for energizing and de-energizing motor 34 include drive pin sensing means 38 which senses each time a drive pin 30 on chain 28 occupies a predetermined position with respect to sensing means 38. Sensing means 38 can be used to produce control signals which either directly or indirectly can be used to stop motor 34 which, in turn, stops chain 28 and any fixture 26 being moved by a drive pin 30 of chain 28 along the fixture guide rail 16 between position 22 and position 24. Typically, drive chain 28 will be advanced by drive motor 34 a distance equal to the space between adjacent drive pins 30, substantially three inches in the preferred embodiment. Typically, each time motor 34 is stopped by being de-energized, chain 28 is stopped as a drive pin 30 is about to contact, or is in close proximity to, a fixture 26 positioned in transferor station 22. Similarly, in this mode of operation, chain 28 will be stopped each time a fixture 26 is substantially properly positioned in transferee station 24.

Drive pin sensor 38, in the preferred embodiment, has a circuit including a light-emitting diode mounted in photodiode housing 40, and a circuit including a conventional phototransistor in phototransistor housing 42. Photodiode housing 40 is positioned on one side of chain 28 and phototransistor housing 42 is positioned on the other so that as a drive pin 30 passes between housings 40, 42, the narrow beam of light produced by the photodiode and its associated optical lens system which is focused on the phototransistor in housing 42, is broken or interrupted which can be used to produce control signals to de-energize motor 34 as is well known in the art. Alternatively, a movable arm of an electromechanical switch, such as a microswitch, can be deflected by each drive pin 30 as it moves past pin sensor 38 to produce the control signals. In order to adjust with substantial precision where belt 28 stops each time a control signal is produced by drive pin sensor 38, sensor 38 can be mounted on plate 12 for limited movement parallel to the direction of movement of chain 28 between pulleys 32a and 32b.

The control signals produced by sensor 38 can be used to control a conventional logic circuit which, in turn, controls a relay which energizes and de-energizes motor 34. The control circuit for motor 34 can stop the energization of motor 34 for a predetermined delay, or until some other event, or events, has occurred, whereupon motor 34 would be again energized to put chain 38 into motion once again.

Figure 6:
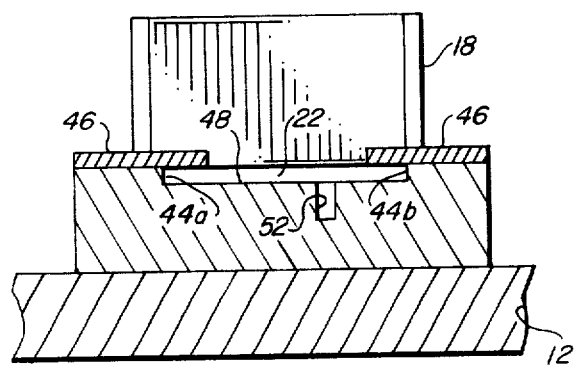
FIG. 6 is a partial section taken on line 6—6 of FIG. 1.

Fixture guide rail 16 is provided with slots 44a, 44b, as is best illustrated in FIG. 6, through which each fixture 26 that is transported from station 22 to station 24 moves or slides. Slots 44a and 44b are formed in the preferred embodiment by securing thin sheets, or plates, of aluminum 46 to the top surface of guide 16 so that they partially overlie the groove 48 formed in guide 16. Slots 44a, 44b prevent fixtures 26 from turning or twisting; i.e., substantially limit them to one degree of freedom of movement along guide rail 16. Fixture guide rail 16 is, in the preferred embodiment, made of several plates of aluminum which have a cross-section such as is illustrated in FIG. 6. The distance, or space, between transferor station 22 and transferee station 24 can be made relatively long, so that several work stations such as work station 50, which is illustrated in FIG. 1, may be located between stations 22 and 24. More than one work station 50 can be provided along guide rail 16 so that more than one function, or operation, can be performed on the workpiece, such as an IC chip carried by each fixture 26 during the period chain 28 is stopped, for example, as the fixtures progress from station 22 to station 24 in a series of steps of substantially equal length.

Fixture guide rail 16 is provided with a chain guide recess 52 through which chain 28 moves. Chain guide recess 52 prevents that portion of chain 28 between sprockets 32b and 32c from twisting as it moves through guide rail 16 with the drive pins 30 of that portion moving fixtures 26 along guide rail 16 from station 22 to station 24. As a result, the drive pins of that portion of chain 28 in moving through the fixture guide 16 are always substantially vertical while traversing guide rail 16. Chain guide recess 52 is not centered in groove 48 or with respect to the fixtures 26 since it is preferable to have each pin 30 contact a relatively straight transverse portion of each fixture 48 instead of one of the notches 54, for example.

Figure 3:
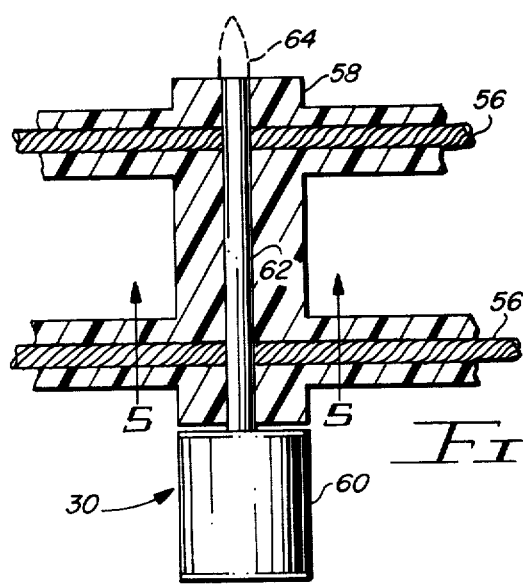
FIG. 3 is a section taken on line 3—3 of FIG. 2.
Figure 4:
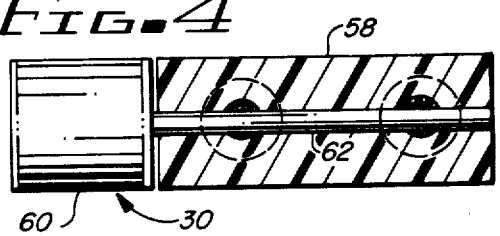
FIG. 4 is a section taken on line 4—4 of FIG. 2.
Figure 5:
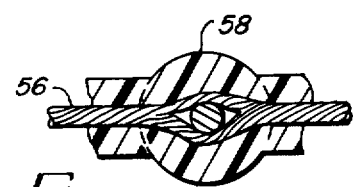
FIG. 5 is a section taken on line 5—5 of FIG. 3.

In the preferred embodiment, chain 28 is a standard commercially available flexible plastic chain with a tempered stainless steel strand reinforcement that is manufactured by Winfred M. Berg Inc. and is identified as Product No. 25CCF plastic timing cable chain. Chain 28 requires no lubrication and is provided with two reinforcing cables 56, each of which is made up of 49 stainless steel wires. The overall diameter of each cable 56 is approximately 0.032 inches. The links 58 are spaced approximately 0.25 inches apart. Each driving pin 30 is provided with an enlarged head 60 and a pin portion, or shank, 62 which is provided with a sharply pointed end 64 which is illustrated in dash lines in FIG. 3. To insert a driving pin 30 into a selected link 58, a link 58 is positioned in a guide which holds it substantially immovable and a 0.032 inches diameter pin held in a pin vice is used to pierce the plastic portion of the link 58 to substantially part a cable 56 in the center thereof so that the pin passes essentially between equal numbers of the wires of each cable 56, as illustrated in FIGS. 4 and 5. Using a piercing guide and the 0.032 diameter piercing pin produces a hole substantially through one-half of the link 56. Chain 28 is then turned over and the piercing pin is then inserted through the remaining part of the link 58 and the second cable 56. A driving pin 30 has its pointed end 64 inserted into the opening formed in the link 58 until its head 60 substantially contacts one end of the link 58. The pointed portion 64 of driving pin 30 is then ground off to make the end of its pin portion 62 substantially flush with the other end of link 58, as seen in FIG. 3. Forcing pin portion 62 of drive pin 30 through a link 58 will cause the diameter of the link 58 to increase slightly. To make certain that the effective width of the links 58 in which a drive pin 30 is mounted is substantially constant, or equal to that of the unmodified links 58, the increase in diameter of the links 58 into which pins 30 are inserted can be reduced, or trimmed, to maintain at least the transverse width of each such link 58 substantially equal to those without pins.

In operation, means, such as are illustrated in the application of DeWayne Karcher entitled "Transfer System", which is incorporated by reference into this application, will provide fixtures 26 to the transferor, or first station, 22 as the fixture 26 occupying transferor station 22 is removed from that station by the transport system of this invention. When the transport system is enabled, or first energized, by an operator turning on a manual switch, for example, motor 34 rotates sprocket wheel 32a causing chain 28 to advance, or move in the direction of arrow 36, until a pin 30 intersects the narrow beam of light produced by the photodiode of the drive pin sensing means 38. The breaking of the beam of light produces a control signal to de-energize and stop motor 34. The distance motor 34 advances chain 28 each time it is energized is typically the distance between two adjacent drive pins 30. Sensing means 38 is positioned so that when motor 34 is de-energized and chain 28 stops, a drive pin 30 is in close proximity to a fixture 26 in transferor station 22. When motor 34 is again energized, it will advance chain 28 in the direction of arrow 36 a single step of three inches, in the preferred example. Each such step will move a fixture 26 out of transferor station 22 and permit the next vertically adjacent fixture in the stack of such fixtures, for example, to drop into, or be loaded into, station 22. In the preferred embodiment, each time drive chain 28 is moved one unit, or step, it is stopped by the sensor means 38.

Sensor 38, when it detects a pin 30, not only can stop the motor 34 but the control signal produced can be used to cause other operations to occur at work stations 50 or at the transferee station 24. In the application entitled "Transfer System" incorporated by reference into this application, each fixture 26 transported to transferee station 24 is lifted, or loaded, into a magazine which is not illustrated in this application for storage in the magazine. Since there are several units of distance, or steps, between the first station 22 and the last station 24, with the length of each step being substantially equal to the distance between adjacent pins 30 of plastic timing chain cable 28, the number of times that chain 28 is advanced, or is stepped, until a given fixture 26 reaches last station 24 depends upon the distance between the initial station 22 and the last or transferee station 24. At any location, or station, on fixture guide rail 16 where a fixture 26 is positioned at the completion of a step, a work station 50, for example, can be located. At each such work station, a testing or manufacturing operation on a workpiece carried by each such fixture 26 can be performed. After a fixture 26 is transported to transferee station 24, the fixture then is loaded into a transferee magazine as described in the above cross-referenced application. Each time detector 38 detects a drive pin 30, detector 28 will produce a signal which can stop motor 34 and cause or enable various manufacturing operations to occur at the various work stations 50 located along guide rail 16. After a predetermined delay, or after various manufacturing operations at the work station and the loading of a fixture 26 in transferee station 24 are completed, motor 34 is again energized to advance chain 28 another step. While in the preferred mode, chain 28 is advanced a step, or increment, at a time, it is within the capability of the transport system of this invention for motor 34 to be continuously energized. During such a mode of operation, control signals produced by sensor 38 do not control motor 34, but are used to control loading of the fixtures transported to transferee station 24 into a storage magazine, for example, and such other functions as can be performed by a work station while the fixtures 26 remain in motion.

From the foregoing, it is obvious that this invention provides an improved transport system for transporting fixtures from a first station to a last station, either in incremental steps or continuously. The system is such that it can be used in a clean room in which modern semiconductor products and high-performance electronic systems are typically assembled. It is also seen that this transport system advances the fixtures holding a workpiece while maintaining a predetermined distance between fixtures, which distance is greater than the dimensions of the fixtures. Movement of the fixtures is precisely controlled as the fixtures move from the first station to the last station.

What is claimed is:

1. A transport system for transporting fixtures serially from a fixture transferor station to a fixture transferee station, comprising:
    fixture guide rail means interconnecting the transferor station and the transferee station, said rail means having means forming a chain guide recess extending from the transferor station to the transferee station;
    a plurality of sprockets;

a continuous plastic timing chain cable having transverse links mounted on said sprockets, said sprockets being positioned relative to said guide rail means so that the timing chain is positioned in the chain guide recess of the guide rail means with the transverse links being substantially vertical;

means for causing one of said sprockets to rotate in a given direction;

drive pins having a head and a shank mounted in selected ones of the links of the chain by inserting the shanks of the drive pins into the selected ones of said links, the heads of the pins projecting from the side of said chain so as to project beyond the chain guide recess to initially contact a fixture positioned in the transferor station; the distance between drive pins being substantially constant; and control means for controlling said means for causing one of said sprockets to rotate in a given direction.

2. A transport system as defined in claim 1, in which the fixture guide rail means limits fixtures transported along said guide rail means between the transferor and transferee station to substantially a single degree of freedom.

3. A transport system as defined in claim 2, in which the motor is an electrically powered synchronous stepping motor.

4. A transport system as defined in claim 3, in which the distance between drive pins is greater than the dimensions of the fixture in the direction of movement.

5. A transport system as defined in claim 4, in which the control means senses each time a drive pin occupies a predetermined position related to said control means.

6. A transport system as defined in claim 5, in which the control system comprises means for producing a beam of electromagnetic energy which is interrupted by the passage of a drive pin, which interruption is detected to produce control signs for periodically de-energizing the stepping motor.

* * * * *